(12) United States Patent
Ueda et al.

(10) Patent No.: US 11,083,092 B2
(45) Date of Patent: Aug. 3, 2021

(54) PLANAR COIL ELEMENT AND METHOD FOR PRODUCING PLANAR COIL ELEMENT

(71) Applicant: SUMITOMO ELECTRIC PRINTED CIRCUITS, INC., Koka (JP)

(72) Inventors: Hiroshi Ueda, Koka (JP); Kousuke Miura, Koka (JP); Yoshihito Yamaguchi, Koka (JP); Yuka Urabe, Koka (JP)

(73) Assignee: SUMITOMO ELECTRIC PRINTED CIRCUITS, INC., Koka (JP)

( * ) Notice: Subject to any disclaimer, the term of this patent is extended or adjusted under 35 U.S.C. 154(b) by 971 days.

(21) Appl. No.: 15/557,255

(22) PCT Filed: Mar. 10, 2016

(86) PCT No.: PCT/JP2016/057486
§ 371 (c)(1),
(2) Date: Sep. 11, 2017

(87) PCT Pub. No.: WO2016/147993
PCT Pub. Date: Sep. 22, 2016

(65) Prior Publication Data
US 2018/0054900 A1  Feb. 22, 2018

(30) Foreign Application Priority Data
Mar. 13, 2015 (JP) ............... JP2015-051361

(51) Int. Cl.
*H01F 5/00* (2006.01)
*H05K 3/46* (2006.01)
(Continued)

(52) U.S. Cl.
CPC ....... *H05K 3/4673* (2013.01); *H01F 17/0013* (2013.01); *H01F 27/327* (2013.01);
(Continued)

(58) Field of Classification Search
CPC .............. H01F 27/323; H01F 27/32
(Continued)

(56) References Cited

U.S. PATENT DOCUMENTS 6,600,404 B1 *  7/2003  Kajino ............... H01F 5/003
                                             257/531
2015/0035640 A1  2/2015  Wang et al.
(Continued)

FOREIGN PATENT DOCUMENTS

CN    103366920 A   10/2013
JP    H07-19950 B    3/1995
(Continued)

*Primary Examiner* — Ronald Hinson
(74) *Attorney, Agent, or Firm* — Faegre Drinker Biddle & Reath LLP

(57) ABSTRACT

A planar coil element of the present invention includes an insulating base film having a first surface and a second surface opposite to the first surface, a first conductive pattern deposited on the first surface side of the insulating base film, and a first insulating layer covering the first conductive pattern on the first surface side, in which the first conductive pattern includes a core body and a widening layer deposited by plating on the outer surface of the core body, and the ratio of the average thickness of the first conductive pattern to the average circuit pitch of the first conductive pattern is ½ or more and 5 or less.

9 Claims, 4 Drawing Sheets

(51) Int. Cl.
*H05K 3/24* (2006.01)
*H05K 1/16* (2006.01)
*H01F 17/00* (2006.01)
*H01F 41/04* (2006.01)
*H01F 27/32* (2006.01)
*H01F 41/12* (2006.01)

(52) U.S. Cl.
CPC ......... *H01F 41/041* (2013.01); *H01F 41/043* (2013.01); *H01F 41/127* (2013.01); *H05K 1/165* (2013.01); *H05K 3/241* (2013.01); *H05K 3/4626* (2013.01); *H05K 3/4644* (2013.01); *H01F 2017/0073* (2013.01); *H05K 2203/1476* (2013.01); *H05K 2203/1572* (2013.01)

(58) Field of Classification Search
USPC ........................................................ 336/200
See application file for complete search history.

(56) References Cited

U.S. PATENT DOCUMENTS

| | | | |
|---|---|---|---|
| 2015/0255208 A1* | 9/2015 | Kim | H01F 17/0006 336/200 |
| 2016/0155550 A1* | 6/2016 | Ohkubo | H01F 1/24 336/233 |

FOREIGN PATENT DOCUMENTS

| | | |
|---|---|---|
| JP | H07-211537 A | 8/1995 |
| JP | H11-204337 A | 7/1999 |
| JP | 2001-189215 A | 7/2001 |
| JP | 2001-267166 A | 9/2001 |
| JP | 2004-319570 A | 11/2004 |
| JP | 2004-319571 A | 11/2004 |
| JP | 2005-150329 A | 6/2005 |
| JP | 2007-53174 A | 3/2007 |
| JP | 2012-89700 A | 5/2012 |

\* cited by examiner

PLANAR COIL ELEMENT AND METHOD FOR PRODUCING PLANAR COIL ELEMENT

TECHNICAL FIELD

The present invention relates to a planar coil element and a method for producing a planar coil element.

BACKGROUND ART

In recent years, reductions in the size and weight of electronic devices have required a further reduction in the size of electronic components, such as planar coil elements, included in electronic devices. With regard to such a planar coil that can be reduced in size, a planar coil described in, for example, Japanese Unexamined Patent Application Publication No. 2012-89700 (PTL 1) has been developed.

The planar coil described in PTL 1 is produced by forming a primary copper coating layer on a substrate, removing the substrate, and forming a secondary copper coating layer on a surface of the primary copper coating layer that has been in contact with the substrate. Thus, this planar coil can be reduced in size by increasing the aspect ratio of the coating layer to a certain degree, compared with a planar coil formed only of a primary copper coating layer on a substrate.

CITATION LIST

Patent Literature

PTL 1: Japanese Unexamined Patent Application Publication No. 2012-89700

SUMMARY OF INVENTION

Technical Problem

In the planar coil described in PTL 1, however, although the thickness of the coating layer can be increased, the width of the coating layer cannot be increased, thus failing to be sufficiently reduced in size.

In the planar coil described in PTL 1, at least (1) a step of forming a primary copper coating layer on a substrate, (2) a step of covering the primary copper coating layer with an inner coat resin layer, (3) a step of removing the substrate by etching, (4) a step of forming a secondary copper coating layer on a surface of the primary copper coating layer that has been in contact with the primary copper coating layer, and (5) a step of covering the secondary copper coating layer with an overcoat layer are included. Thus, the long production process of the planar coil described in PTL 1 results in a high cost and a low yield.

The present invention has been accomplished in light of the foregoing circumstances. It is an object of the present invention to provide a further miniaturized planar coil element. Furthermore, it is an object of the present invention to provide a method for producing a planar coil element, the method being capable of easily and reliably producing a further miniaturized planar coil element while the increase of the number of steps of the production method is inhibited.

Solution to Problem

According to an aspect of the present invention to solve the foregoing problems, a planar coil element includes an insulating base film having a first surface and a second surface opposite to the first surface, a first conductive pattern deposited on a first surface side of the insulating base film, and a first insulating layer covering the first conductive pattern on the first surface side, in which the first conductive pattern includes a core body and a widening layer deposited on an outer surface of the core body, and a ratio of an average thickness of the first conductive pattern to an average circuit pitch of the first conductive pattern is ½ or more and 5 or less.

According to another aspect of the present invention to solve the foregoing problems, a method for producing a planar coil element that includes an insulating base film having a first surface and a second surface opposite to the first surface, a first conductive pattern deposited on a first surface side of the insulating base film, and a first insulating layer covering the first conductive pattern on the first surface side includes the steps of forming a core body of the first conductive pattern by a subtractive method or a semi-additive method, depositing a widening layer of the first conductive pattern on an outer surface of the core body by plating, and covering the first conductive pattern on the first surface side with an insulating resin, in which a ratio of an average thickness of the first conductive pattern to an average circuit pitch of the first conductive pattern is ½ or more and 5 or less.

Advantageous Effects of Invention

The planar coil element according to the present invention can have a reduced size. The method for producing a planar coil element according to the present invention can easily and reliably produce a further miniaturized planar coil element while the increase of the number of steps of the production method is inhibited.

DESCRIPTION OF EMBODIMENTS

Description of Embodiments of Invention

Figure 1:
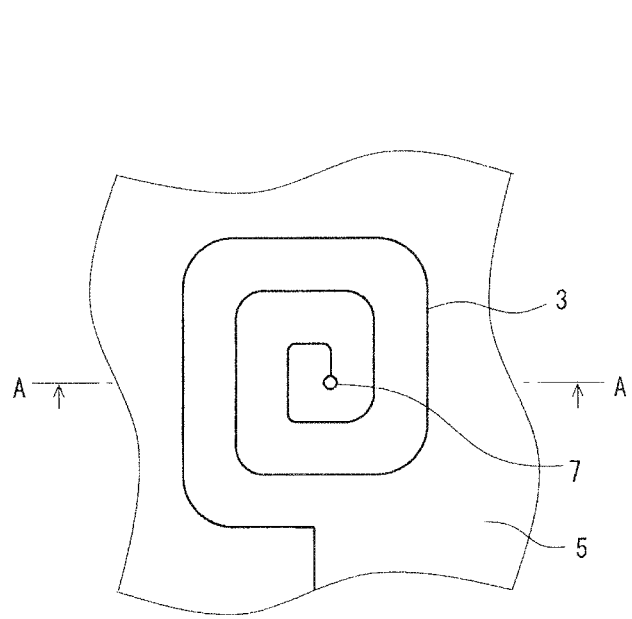
FIG. 1 is a schematic plan view of a planar coil element according to a first embodiment of the present invention.

Embodiments of the present invention are first listed and explained.

A planar coil element according to an embodiment of the present invention includes an insulating base film having a first surface and a second surface opposite to the first surface; a first conductive pattern deposited on a first surface side of the insulating base film; and a first insulating layer covering the first conductive pattern on the first surface side, in which the first conductive pattern includes a core body and a widening layer deposited on an outer surface of the core body, and a ratio of an average thickness of the first conductive pattern to an average circuit pitch of the first conductive pattern is ½ or more and 5 or less.

In the planar coil element, the first conductive pattern includes the core body formed by a subtractive method or a semi-additive method and the widening layer deposited on the outer surface of the core body by plating. Thus, in the planar coil element, the first conductive pattern can have a narrow circuit gap width and an increased density. In the planar coil element, the ratio of the average thickness of the first conductive pattern to the average circuit pitch of the first conductive pattern is within the range described above. Thus, the first conductive pattern can have an increased thickness and an increased aspect ratio (the ratio of the thickness to the width of the bottom of the first conductive pattern) while the arrangement pattern is maintained at high density. Accordingly, the planar coil element can have a reduced size.

The first conductive pattern preferably has an average circuit pitch of 20 µm or more and 100 µm or less. In this case, because the average circuit pitch of the first conductive pattern is within the range described above, the first conductive pattern can have an increased density easily and reliably while the first conductive pattern has a narrow circuit gap width.

The ratio of an average circuit gap width at a height position of ½ the average thickness to the average circuit gap width in a bottom portion of the first conductive pattern is preferably 2 or less. In this case, because the ratio of the average circuit gap width at a height position of ½ the average thickness to the average circuit gap width in the bottom portion of the first conductive pattern is within the range described above, the first conductive pattern can have an increased cross-sectional area.

The ratio of the average circuit gap width at a height position of ⅔ the average thickness to the average circuit gap width in the bottom portion of the first conductive pattern is preferably 2 or less. In this case, because the ratio of the average circuit gap width at a height position of ⅔ the average thickness to the average circuit gap width in the bottom portion of the first conductive pattern is within the range described above, the first conductive pattern can have a further increased cross-sectional area.

The first conductive pattern preferably has a top portion having a cross section with a semicircular shape. In general, shorter distances between coils and magnetic materials improve characteristics of coils. Thus, the insulating layer that covers the conductive pattern on the surface side preferably has a smaller thickness. In the case of the conventional planar coil described in PTL 1, a resin having good flowability is required to be used for an inner coat resin layer and an overcoat resin layer with which a conductive pattern is covered in order to fill gaps between circuits without forming voids. To improve insulation of the planar coil, a pair of outer surface insulating layers is stacked on surfaces of the inner coat layer and the overcoat layer. As a result, in this planar coil, the resin layers stacked on the front surface side of the conductive pattern have a large thickness to lead to the degradation of characteristics, failing to contribute to a reduction in size. In contrast, in the case of the planar coil element, because the first conductive pattern has the top portion having the cross section with the semicircular shape, when a resin is applied from the top side of the first conductive pattern, the circuit gaps of the first conductive pattern are easily and reliably filled with the resin. This enables the first conductive pattern to be easily and reliably covered with the first insulating layer to provide increased insulation.

Each of the core body and the widening layer preferably contains copper or a copper alloy as a main component. In this case, because each of the core body and the widening layer contains copper or the copper alloy as a main component, the first conductive pattern can have improved conductivity while the production cost of the first conductive pattern is suppressed.

The insulating base film preferably contains a polyimide as a main component, and the first insulating layer preferably contains an epoxy resin as a main component. In this case, because the insulating base film contains the polyimide as a main component, and the first insulating layer contains the epoxy resin as a main component, the insulating base film and the first insulating layer can have a reduced thickness to contribute to a reduction in size.

Preferably, a second conductive pattern deposited on a second surface side of the insulating base film, and a second insulating layer covering the second conductive pattern on the second surface side are further included, in which the second conductive pattern includes a core body and a widening layer deposited on an outer surface of the core body. In this case, because the second conductive pattern and the second insulating layer are deposited on the second surface side of the insulating base film, and the second conductive pattern includes the core body and the widening layer, an increased number of coil turns can be used, and the inductance can be adjusted, while increases in the area and the thickness of the pattern are suppressed. This can contribute to a reduction in size while a high coupling coefficient of the coil is provided.

Preferably, a through hole electrically connecting the first conductive pattern to the second conductive pattern is further included. In this case, because the through hole electrically connecting the first conductive pattern to the second conductive pattern is included, the first conductive pattern and the second conductive pattern can be electrically connected together easily and reliably to contribute to an increase in density.

The first conductive pattern and the second conductive pattern preferably have an identical pattern, and the difference in position in a width direction between the center line of the first conductive pattern and the center line of the second conductive pattern is preferably 40% or less the average circuit pitch. In this case, because the first conductive pattern and the second conductive pattern have the identical pattern, and the difference in position in the width direction between the center lines of the first conductive pattern and the second conductive pattern is within the range described above, a high coupling coefficient of the coil can be provided. In this structure, the through hole can be easily formed.

A method for producing a planar coil element according to an embodiment of the present invention is a method for producing a planar coil element that includes an insulating base film having a first surface and a second surface opposite to the first surface, a first conductive pattern deposited on a first surface side of the insulating base film, and a first insulating layer covering the first conductive pattern on the first surface side, the method including the steps of forming a core body of the first conductive pattern by a subtractive method or a semi-additive method, depositing a widening layer of the first conductive pattern on an outer surface of the core body by plating, and covering the first conductive pattern on the first surface side with an insulating resin, in which the ratio of the average thickness of the first conductive pattern to the average circuit pitch of the first conductive pattern is ½ or more and 5 or less.

Because the method for producing a planar coil element includes the step of forming the core body of the first conductive pattern by the subtractive method or the semi-additive method and the step of depositing the widening layer of the first conductive pattern on the outer surface of the core body by plating, the circuit gap width of the first conductive pattern can be reduced to increase the density of the first conductive pattern. Furthermore, in the method for producing a planar coil element, because the ratio of the average thickness of the first conductive pattern to the average circuit pitch of the first conductive pattern is within the range described above, the aspect ratio of the first conductive pattern can be increased by increasing the thickness of the first conductive pattern while the arrangement pattern is maintained at high density. Thus, in the method for producing a planar coil element, it is possible to easily and reliably produce a miniaturized planar coil element while the increase of the number of steps of the production method is inhibited.

The term "average circuit pitch" used in the present invention refers to the average shortest distance between the centers of adjacent circuit portions. The term "semicircular shape" widely includes an arc shape having a certain radius of curvature and a shape curved in one direction from the middle portion toward both ends, and, for example, also includes a shape having a straight line portion in the middle portion and curved lines extending from both ends of the straight portion. The term "main component" refers to a component whose content is largest, and, for example, indicates a component whose content is 50% or more by mass. The term "center line of the conductive pattern" refers to a line equidistant from both ends of the conductive pattern in the width direction.

DETAILS OF EMBODIMENTS OF INVENTION

A planar coil element and a method for producing a planar coil element according to an embodiment of the present invention will be described below with reference to the drawings.

First Embodiment

<Planar Coil Element>

Figure 2:
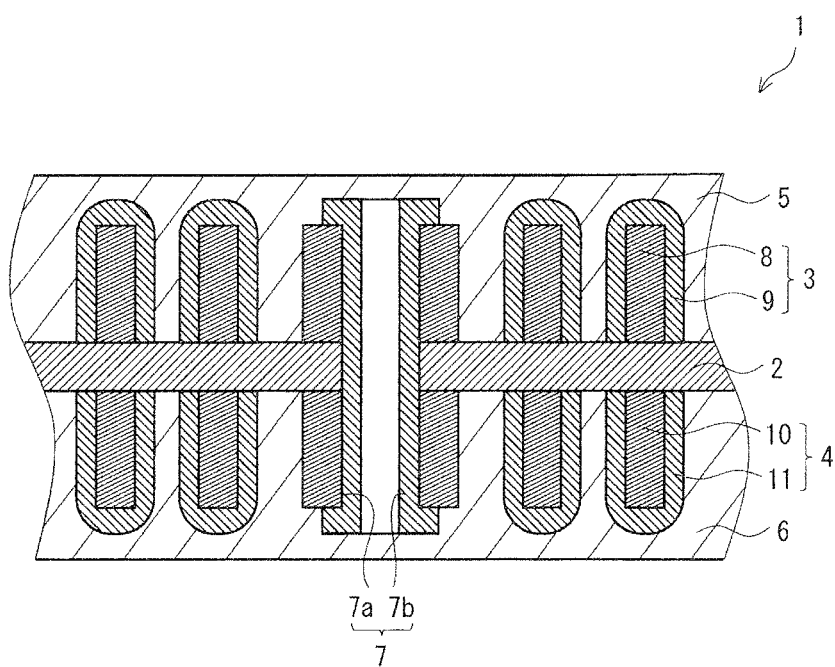
FIG. 2 is a cross-sectional view, taken along line A-A, of the planar coil element of FIG. 1.

A planar coil element 1 illustrated in FIGS. 1 and 2 mainly includes an insulating base film 2, a first conductive pattern 3, a second conductive pattern 4, a first insulating layer 5, a second insulating layer 6, and a through hole 7. The planar coil element 1 is a flexible planar coil element having flexibility.

(Insulating Base Film)

The insulating base film 2 has insulating properties and flexibility. Examples of the main component of the insulating base film 2 include synthetic resins such as polyimides, poly(ethylene terephthalate), fluororesins, and liquid crystal polymers. Among these, a polyimide, which has, for example, good insulating properties, flexibility, and heat resistance, is preferred.

The lower limit of the average thickness of the insulating base film 2 is preferably 3 μm, more preferably 5 μm, even more preferably 10 μm. The upper limit of the average thickness of the insulating base film 2 is preferably 150 μm, more preferably 100 μm, even more preferably 80 μm. If the insulating base film 2 has an average thickness of less than the lower limit, the insulating properties and the mechanical strength can be insufficient. If the insulating base film 2 has an average thickness of more than the upper limit, it can conflict with the need for the miniaturization of the planar coil element 1. The term "average thickness" refers to the distance between the average line of an interface on the side of a front surface and the average line of an interface on the side of a back surface in measuring length in a cross section of an object in the thickness direction. The term "average line" used here refers to an imaginary line that is drawn along the interface in such a manner that the total area of peaks defined by the interface and the imaginary line (the total area of upper side portions with respect to the imaginary line) is equal to the total area of troughs (the total area of a lower side portions with respect to the imaginary line).

(First Conductive Pattern)

The first conductive pattern 3 is deposited on a first surface side of the insulating base film 2. The first conductive pattern 3 has a continuous line shape and includes a spiral portion deposited on the first surface side of the insulating base film 2 and an externally extending lead portion connected to the outermost end part of the spiral portion. The first conductive pattern 3 includes a core body 8 and a widening layer 9.

(Core Body)

The core body 8 is formed so as to have a quadrangular-shaped cross section. The core body 8 is formed by a subtractive method or semi-additive method. In the subtractive method, metal foil laminated on the insulating base film 2 is etched to form the core body 8 having a desired shape. In the semi-additive method, a thin conductive layer (seed layer) is formed on the first surface side of the insulating base film 2. A resist pattern is formed by a photoresist process on a surface of the seed layer. Plating is performed on the exposed seed layer using the resist pattern as a mask to form the core body 8 having a desired shape.

Examples of a material of the core body 8 include copper, aluminum, silver, gold, nickel, alloys thereof, and stainless steel. Among these, copper or a copper alloy is preferred as a main component of the core body 8 from the viewpoint of achieving good conductivity and cost reduction.

The lower limit of the average width of the core body 8 is preferably 2 μm, more preferably 5 μm. The upper limit of the average width of the core body 8 is preferably 30 μm, more preferably 20 μm. If the core body 8 has an average width of less than the lower limit, the width of the first conductive pattern 3 can fail to be sufficiently increased, thereby possibly failing to sufficiently increase the density of the first conductive pattern 3. If the core body 8 has an average width of more than the upper limit, it can conflict with the need for the miniaturization of the planar coil element 1. The term "average width of the core body 8" refers to the average of the width (length in the direction perpendicular to the center line of the core body 8) of the bottom portion of the core body 8 (a surface on the side of the insulating base film 2).

The cross-sectional shape of the core body 8 is preferably a trapezoidal shape having two sides substantially parallel to the surface of the insulating base film 2, the base on the side of the insulating base film 2 being longer than the upper base. The lower limit of the ratio of the width of the top portion (a surface opposite to the bottom portion) to the width of the bottom portion of the core body 8 is preferably ½, more preferably ⅗. The upper limit of the ratio of the width of the top portion to the width of the bottom portion of the core body 8 is preferably 1. If the ratio of the width of the core body 8 is less than the lower limit, the first conductive pattern 3 can have a tapered shape and thus can fail to have a sufficiently large cross-sectional area. If the ratio of the width of the core body 8 is more than the upper limit, the widening layer 9 can fail to be appropriately formed.

The lower limit of the average thickness of the core body 8 is preferably 5 μm, more preferably 10 μm, even more preferably 20 μm. The upper limit of the average thickness of the core body 8 is preferably 90 μm, more preferably 70 μm, even more preferably 50 μm. If the average thickness of the core body 8 is less than the lower limit, the thickness of the first conductive pattern 3 can fail to be sufficiently increased, thereby possibly increasing the resistance. If the average thickness of the core body 8 is more than the upper limit, it can conflict with the need for the miniaturization of the planar coil element 1.

The lower limit of the aspect ratio of the core body 8 (the ratio of the average thickness to the average width of the bottom portion of the core body 8) is preferably 3/2, more preferably 2. The upper limit of the aspect ratio of the core body 8 is preferably 6, more preferably 5. If the aspect ratio of the core body 8 is less than the lower limit, the aspect ratio of the first conductive pattern 3 can fail to be sufficiently increased, thereby possibly failing to provide the planar coil element 1 having a sufficiently reduced size. If the aspect ratio of the core body 8 is more than the upper limit, the first conductive pattern 3 can have an excessively large thickness to decrease the strength and the ease of formation.

The lower limit of the average circuit gap width in the bottom portion of the core body 8 is preferably 10 μm, more preferably 15 μm. The upper limit of the average circuit gap width in the bottom portion of the core body 8 is preferably 50 μm, more preferably 30 μm. If the average circuit gap width is less than the lower limit, it can be difficult to produce the core body 8 by an etching factor and so forth. If the average circuit gap width is more than the upper limit, the density of the first conductive pattern 3 can fail to be sufficiently increased. The term "average circuit gap width" refers to the average shortest distance between adjacent circuit portions.

(Widening Layer)

The widening layer 9 is deposited by plating on the outer surface of the core body 8. The widening layer 9 is deposited so as to cover the whole of side surfaces and the top portion of the core body 8.

The plating may be, but not particularly limited to, any of electroplating and electroless plating. Electroplating is more preferred. Examples of the type of plating include copper plating, gold plating, nickel plating, and plating of alloys thereof. Among these, copper plating or copper alloy plating is preferred from the viewpoint of achieving good conductivity and cost reduction.

The main component of the widening layer 9 is preferably identical to that of the core body 8. The use of the identical main component of the core body 8 and the widening layer 9 results in uniform electrical characteristics, such as a dielectric constant, of the first conductive pattern 3 to improve the coil characteristics. In particular, the main component of the core body 8 and the widening layer 9 is preferably copper or a copper alloy. When the main component of both of the core body 8 and the widening layer 9 is copper or a copper alloy, the conductivity of the first conductive pattern 3 can be improved while the production cost of the first conductive pattern 3 is suppressed.

The lower limit of the average thickness of the widening layer 9 is preferably 1 μm, more preferably 3 μm. The upper limit of the average thickness of the widening layer 9 is preferably 15 μm, more preferably 12 μm. If the average thickness of the widening layer 9 is less than the lower limit, the cross-sectional area of the first conductive pattern 3 can fail to be sufficiently improved. If the average thickness of the widening layer 9 is more than the upper limit, the first conductive pattern 3 can be easily short-circuited. The term "average thickness of the widening layer" refers to the average shortest distance from a surface of the widening layer 9 in contact with the core body 8 to the outer surface of the widening layer 9.

(Second Conductive Pattern)

The second conductive pattern 4 is deposited on a second surface side of the insulating base film 2. The second conductive pattern 4 includes a spiral portion deposited on the second surface side of the insulating base film 2 and an externally extending lead portion connected to the outermost end part of the spiral portion. The spiral portion of the second conductive pattern 4 is wound in the same direction as that of the spiral portion of the first conductive pattern 3 when viewed in plan. That is, the first conductive pattern 3 and the second conductive pattern 4 have the same pattern. The second conductive pattern 4 has substantially the same shape as the first conductive pattern 3. The second conductive pattern 4 has a core body 10 and a widening layer 11. The core body 10 is formed by a subtractive method or semi-additive method. The widening layer 11 is deposited by plating on the outer surface of the core body 10. The core body 10 has the same structure as the core body 8 of the first conductive pattern 3. The widening layer 11 has the same structure as the widening layer 9 of the first conductive pattern 3. Thus, descriptions of the core body 10 and the widening layer 11 are omitted.

(First Insulating Layer)

The first insulating layer 5 has insulating properties. The first insulating layer 5 covers the first conductive pattern 3 on the first surface side. The first insulating layer 5 also covers a region of the insulating base film 2 where the first conductive pattern 3 is not deposited on the first surface side. A surface of the first insulating layer 5 on the first surface side is formed so as to be substantially parallel to the first surface of the insulating base film 2. The outermost surface of the planar coil element 1 on the first surface side is formed of the first insulating layer 5. In other words, the insulating properties of the planar coil element 1 on the first surface side are maintained by the first insulating layer 5.

Examples of the main component of the first insulating layer 5 include thermosetting resins such as epoxy resins, phenolic resins, polyamide-imide, and polyimide; and ultraviolet-curable resins such as epoxy resins and acrylic resins. Among these, an ultraviolet-curable epoxy resin, which has good insulating properties, heat resistance, flexibility, and so forth, is preferred as the main component of the first insulating layer 5. With regard to a combination of the insulating base film 2 and the first insulating layer 5, preferably, the main component of the insulating base film 2 is a polyimide, and the main component of the first insulating layer 5 is an epoxy resin. In the case where the main component of the insulating base film 2 is a polyimide and where the main component of the first insulating layer 5 is an epoxy resin, the planar coil element 1 can have, for example, improved heat resistance, flexibility, and insulating properties and can have a small thickness.

The lower limit of the viscosity of a resin to be formed into the first insulating layer 5 at 70° C. is preferably 10 Pa·s, more preferably 30 Pa·s. The upper limit of the viscosity of the resin to be formed into the first insulating layer 5 at 70° C. is preferably 200 Pa·s, more preferably 100 Pa·s. If the viscosity of the resin to be formed into in the first insulating layer 5 is less than the lower limit, the resin can be difficult to charge. If the viscosity of the resin to be formed into the first insulating layer 5 is more than the upper limit, the resin can fail to be appropriately charged to the first surface of the insulating base film 2, thus possibly failing to appropriately cover the first conductive pattern 3 or the insulating base film 2.

The lower limit of the average shortest distance from the top portion of the first conductive pattern 3 to a surface of the first insulating layer 5 on the first surface side is preferably 3 µm, more preferably 5 µm. The upper limit of the average shortest distance from the top portion of the first conductive pattern 3 to the surface of the first insulating layer 5 on the first surface side is preferably 40 µm, more preferably 30 µm. If the average shortest distance is less than the lower limit, sufficient insulating properties can fail to be provided. If the average shortest distance is more than the upper limit, it can conflict with the need for the miniaturization of the planar coil element 1.

(Second Insulating Layer)

The second insulating layer 6 has insulating properties. The second insulating layer 6 covers the second conductive pattern 4 on the second surface side. The second insulating layer 6 covers a region of the insulating base film 2 where the second insulating layer 6 is not deposited on the second surface side. A surface of the second insulating layer 6 on the second surface side is formed so as to be substantially parallel to the second surface of the insulating base film 2. The outermost surface of the planar coil element 1 on the second surface side is formed of the second insulating layer 6. In other words, the insulating properties of the planar coil element 1 on the second surface side are maintained by the second insulating layer 6. The main component of the second insulating layer 6 and the viscosity of a resin contained in the second insulating layer 6 can be the same as those of the first insulating layer 5. The average shortest distance from the top portion of the second conductive pattern 4 to a surface of the second insulating layer 6 on the second surface side can be the same as the average shortest distance from the top portion of the first conductive pattern 3 to the surface of the first insulating layer 5 on the first surface side.

(Through Hole)

The through hole 7 electrically connects the first conductive pattern 3 to the second conductive pattern 4. Specifically, the through hole 7 extends through the core bodies 8 and 10 and the insulating base film 2 to electrically connect the first conductive pattern 3 to the second conductive pattern 4. The through hole 7 can be formed by forming a penetration hole 7a in a laminated body including the core bodies 8 and 10 and the insulating base film 2 and forming a plating film 7b, similar to the widening layers 9 and 11, in the penetration hole 7a. The through hole 7 can also be formed by injecting a silver paste, a copper paste, or the like into the penetration hole 7a and then performing curing by heating. The average diameter of the through hole 7 is appropriately selected in view of processability, conduction properties, and so forth and can be, for example, 20 µm or more and 2,000 µm or less. Because the planar coil element 1 includes the through hole 7 that electrically connects the first conductive pattern 3 to the second conductive pattern 4, the first conductive pattern 3 and the second conductive pattern 4 can be electrically connected together easily and reliably to contribute to an increase in density.

<Structure of Conductive Pattern>

Figure 3:
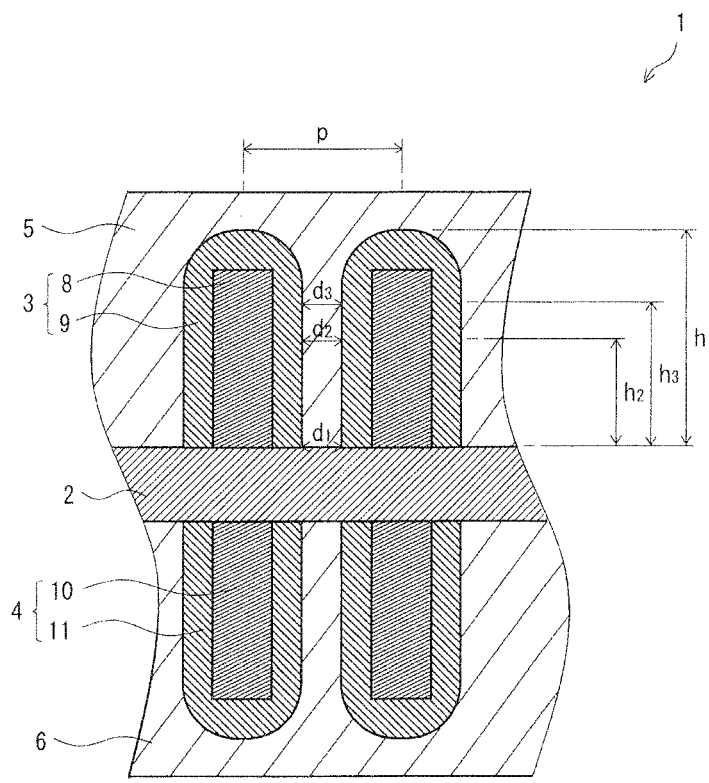
FIG. 3 is a fragmentary enlarged view of the planar coil element of FIG. 2.

The first conductive pattern 3 and the second conductive pattern 4 will be described in detail below with reference to FIG. 3. Because the first conductive pattern 3 and the second conductive pattern 4 have almost the same shape, with regard to individual shapes of the first conductive pattern 3 and the second conductive pattern 4, only the first conductive pattern 3 is described, whereas the description of the second conductive pattern 4 is omitted.

The first conductive pattern 3 includes a rectangular portion that is deposited on the first surface side of the insulating base film 2 and that has a rectangular cross-sectional shape, and a top portion that extends continuously from a surface of the rectangular portion opposite to the surface on which the insulating base film 2 lies and that has a cross section with a semicircular shape. In the planar coil element 1, because the cross-sectional shape of the top portion of the first conductive pattern 3 is a semicircular shape, when a resin is applied from the top side of the first conductive pattern 3, the circuit gaps of the first conductive pattern 3 are easily and reliably filled with the resin. In the planar coil element 1, thus, the first conductive pattern 3 can be easily and reliably covered with the first insulating layer 5.

The lower limit of the average thickness h of the first conductive pattern 3 is preferably 10 µm, more preferably 20 µm, even more preferably 30 µm. The upper limit of the average thickness h of the first conductive pattern 3 is preferably 100 µm, more preferably 80 µm. If the average thickness h of the first conductive pattern 3 is less than the lower limit, the first conductive pattern 3 can fail to have a sufficiently large cross-sectional area, thereby possibly failing to sufficiently increase the density. If the average thickness h of the first conductive pattern 3 is more than the upper limit, it can conflict with the need for the miniaturization of the planar coil element 1. The term "average thickness of the conductive pattern" refers to the average thickness of the conductive pattern at the center in the width direction.

The lower limit of the ratio of the average thickness of the rectangular portion to the average thickness h of the first conductive pattern 3 is preferably ½, more preferably ⅔, even more preferably ¾. The upper limit of the ratio of the average thickness of the rectangular portion to the average thickness h of the first conductive pattern 3 is preferably 19/20, more preferably 9/10. If the average thickness ratio is less than the lower limit, the first conductive pattern 3 can fail to have a sufficiently large cross-sectional area. If the average thickness ratio is more than the upper limit, when a resin to be formed into the first insulating layer 5 has a high viscosity, a difficulty can lie in appropriately charging the resin to the insulating base film 2.

The lower limit of the average circuit pitch p of the first conductive pattern 3 is preferably 20 µm, more preferably 25 µm, even more preferably 30 µm. The upper limit of the average circuit pitch p of the first conductive pattern 3 is preferably 100 µm, more preferably 60 µm, even more preferably 40 µm. If the average circuit pitch p of the first conductive pattern 3 is less than the lower limit, the first conductive pattern 3 can fail to have a sufficiently large width. If the average circuit pitch p of the first conductive pattern 3 is more than the upper limit, the density can fail to be sufficiently increased.

The lower limit of the ratio of the average thickness h of the first conductive pattern 3 to the average circuit pitch p of the first conductive pattern 3 (h/p) is ½, more preferably ⅘, even more preferably 1. The upper limit of the ratio (h/p) is preferably 5, more preferably 4. If the ratio (h/p) is less than the lower limit, the first conductive pattern 3 can fail to have a sufficiently high aspect ratio. If the ratio (h/p) is more than the upper limit, it can conflict with the need for the miniaturization of the planar coil element 1.

The lower limit of the aspect ratio of the first conductive pattern 3 is preferably 6/5, more preferably 2, even more preferably 5/2. The upper limit of the aspect ratio of the first conductive pattern 3 is preferably 21/4, more preferably 4. If the aspect ratio of the first conductive pattern 3 is less than the lower limit, the first conductive pattern 3 can fail to have a sufficiently high density. If the aspect ratio of the first conductive pattern 3 is more than the upper limit, it can conflict with the need for the miniaturization of the planar coil element 1.

The lower limit of the average circuit gap width $d_1$ in the bottom portion of the first conductive pattern 3 is preferably 1 μm, more preferably 3 μm. The upper limit of the average circuit gap width $d_1$ in the bottom portion of the first conductive pattern 3 is preferably 15 μm, more preferably 10 μm. If the average circuit gap width $d_1$ is less than the lower limit, the first conductive pattern 3 can be easily short-circuited. If the average circuit gap width $d_1$ is more than the upper limit, the first conductive pattern 3 can fail to have a sufficiently high density.

The upper limit of the ratio of an average circuit gap width $d_2$ at a height position $h_2$ of ½ the average thickness h to an average circuit gap width $d_1$ in the bottom portion of the first conductive pattern 3 ($d_2/d_1$) is preferably 2, more preferably 3/2. If the ratio ($d_2/d_1$) is more than the upper limit, the rectangular portion can have a small cross-sectional area, thereby possibly failing to increase the density of the first conductive pattern 3. The lower limit of the ratio ($d_2/d_1$) is preferably, but not necessarily, ½, more preferably 1 from the viewpoint of appropriately charging the resin to be formed into the first insulating layer 5 to the insulating base film 2.

The upper limit of the ratio of an average circuit gap width $d_3$ at a height position $h_3$ of ⅔ the average thickness h to an average circuit gap width $d_1$ in the bottom portion of the first conductive pattern 3 ($d_3/d_1$) is preferably 2, more preferably 3/2. If the ratio ($d_3/d_1$) is more than the upper limit, the rectangular portion can have a small cross-sectional area, thereby possibly failing to increase the density of the first conductive pattern 3. The lower limit of the ratio ($d_3/d_1$) is preferably, but not necessarily, ½, more preferably 1 from the viewpoint of appropriately charging the resin to be formed into the first insulating layer 5 to the insulating base film 2.

The upper limit of the difference in position in a width direction between center lines of the first conductive pattern 3 and the second conductive pattern 4 is preferably 40%, more preferably 30%, even more preferably 20% of the average circuit pitch p of the first conductive pattern 3. If the difference in position in the width direction between the center lines of the first conductive pattern 3 and the second conductive pattern 4 is more than the upper limit, the coupling coefficient of the first conductive pattern 3 and the second conductive pattern 4 can fail to be sufficiently increased. The difference in position in the width direction between the center lines of the first conductive pattern 3 and the second conductive pattern 4 is preferably minimized. Thus, the lower limit of the difference in position in the width direction between the center lines of the first conductive pattern 3 and the second conductive pattern 4 can be 0%.

<Advantage>

In the planar coil element 1, the first conductive pattern 3 includes the core body 8 formed by the subtractive method or the semi-additive method and the widening layer 9 deposited by plating on the outer surface of the core body 8. Thus, in the planar coil element 1, the first conductive pattern 3 can have a narrow circuit gap width, and the first conductive pattern 3 can have an increased density. In the planar coil element 1, because the ratio (h/p) of the average thickness h of the first conductive pattern 3 to the average circuit pitch p of the first conductive pattern 3 is within the range described above, the first conductive pattern 3 can have an increased thickness, and the first conductive pattern 3 can have an increased aspect ratio while the arrangement pattern is maintained at high density. Accordingly, the planar coil element 1 can have a reduced size.

The planar coil element 1 includes the second conductive pattern 4 deposited on the second surface side of the insulating base film 2 and the second insulating layer 6 covering the second conductive pattern 4 on the second surface side, the second conductive pattern 4 including the core body 10 and the widening layer 11 deposited on the outer surface of the core body 10. Thus, an increased number of coil turns can be used, and the inductance can be adjusted, while increases in the area and the thickness of the pattern are suppressed. Accordingly, the planar coil element 1 can have a reduced size while a high coupling coefficient of the coil is provided.

<Method for Producing Planar Coil Element>

A method for producing the planar coil element 1 illustrated in FIG. 1 will be described below with reference to FIGS. 4A to 4F.

The method for producing the planar coil element includes the steps of forming the core body 8 of the first conductive pattern 3 and the core body 10 of the second conductive pattern 4 by a subtractive method or a semi-additive method, depositing the widening layer 9 of the first conductive pattern 3 and the widening layer 11 of the second conductive pattern 4 on the outer surfaces of the core bodies 8 and 10, and covering the first conductive pattern 3 on the first surface side and the second conductive pattern 4 on the second surface side with an insulating resin. The method for producing the planar coil element further includes a step of forming the through hole 7 electrically connecting the first conductive pattern 3 to the second conductive pattern 4. Hereinafter, a method for forming the core body 8 of the first conductive pattern 3 and the core body 10 of the second conductive pattern 4 by the semi-additive method will be described.

<Step of Forming Core Body>

As illustrated in FIGS. 4A to 4D, the step of forming the core bodies includes the substeps of depositing thin conductive layers (seed layers) $S_1$ and $S_2$ on both surfaces of the insulating base film 2, forming resist patterns $X_1$ and $X_2$ on surfaces of the seed layers $S_1$ and $S_2$, forming metal patterns $Y_1$ and $Y_2$ by subjecting surface portions of the seed layers $S_1$ and $S_2$ exposed from the resist patterns $X_1$ and $X_2$ to plating, removing the resist patterns $X_1$ and $X_2$, and etching the seed layers $S_1$ and $S_2$ using the metal patterns $Y_1$ and $Y_2$ as masks. The core bodies 8 and 10 formed in the step of forming the core bodies have structures including the seed layers $S_1$ and $S_2$ and the metal patterns $Y_1$ and $Y_2$ stacked in this order.

(Substep of Depositing Seed Layer)

Figure 4A:
FIG. 4A is a schematic, partial cross-sectional view illustrating a step of forming a core body in a method for producing the planar coil element of FIG. 1.

As illustrated in FIG. 4A, in the substep of depositing the seed layers, the seed layer $S_1$ is deposited on the first surface of the insulating base film 2, and the seed layer $S_2$ is deposited on the second surface of the insulating base film 2. The deposition of the seed layers $S_1$ and $S_2$ can be performed by a known method. Examples thereof include electroless plating, sputtering, an evaporation method, and the application of a dispersion of conductive fine particles. Examples of the main component of each of the seed layers $S_1$ and $S_2$ that can be used include known metals such as copper, silver, nickel, palladium, chromium, gold, and alloys thereof. Among these, copper is preferred.

The lower limit of the average thickness of each of the seed layers $S_1$ and $S_2$ is preferably 10 nm, more preferably 100 nm. The upper limit of the average thickness of each of the seed layers $S_1$ and $S_2$ is preferably 1 µm, more preferably 800 nm. If the average thickness of each of the seed layers $S_1$ and $S_2$ is less than the lower limit, a difficulty can lie in forming the metal patterns $Y_1$ and $Y_2$ on surfaces of the seed layers S and $S_2$. If the average thickness of each of the seed layers $S_1$ and $S_2$ is more than the upper limit, portions of the seed layers $S_1$ and $S_2$ other than regions where the core bodies 8 and 10 are formed can fail to be sufficiently removed by etching.

(Substep of Forming Resist Pattern)

Figure 4B:
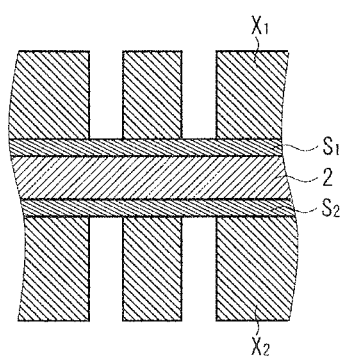
FIG. 4B is a schematic, partial cross-sectional view illustrating a substep subsequent to FIG. 4A in the step of forming a core body of the planar coil element of FIG. 1.

As illustrated in FIG. 4B, in the substep of forming the resist patterns, the resist patterns $X_1$ and $X_2$ are formed on the surfaces of the seed layers $S_1$ and $S_2$. Specifically, resist films are deposited on the surfaces of the seed layers $S_1$ and $S_2$, and then subjected to exposure and development to form the resist patterns $X_1$ and $X_2$ having a predetermined pattern. Examples of a method for depositing the resist films include a method in which a resist composition is applied to the surfaces of the seed layers $S_1$ and $S_2$; and a method in which a dry-film photoresist is stacked on the surface of each of the seed layers $S_1$ and $S_2$. Exposure and development conditions of the resist films can be appropriately adjusted, depending on the resist composition and so forth.

(Substep of Forming Metal Pattern)

Figure 4C:
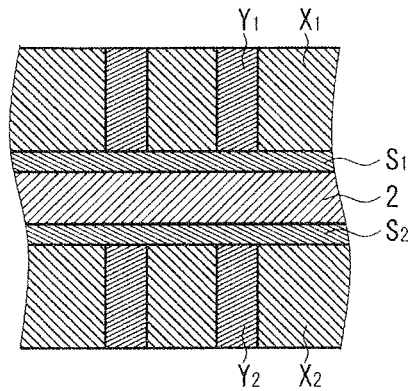
FIG. 4C is a schematic, partial cross-sectional view illustrating a substep subsequent to FIG. 4B in the step of forming a core body of the planar coil element of FIG. 1.

In the substep of forming the metal patterns, as illustrated in FIG. 4C, the metal patterns $Y_1$ and $Y_2$ are formed by electroplating on portions of the seed layers $S_1$ and $S_2$ where the resist patterns $X_1$ and $X_2$ are not deposited. With regard to the type of electroplating, the same material as that exemplified for the core bodies 8 and 10 is used.

(Substep of Removing Resist Pattern)

In the substep of removing the resist patterns, the resist patterns $X_1$ and $X_2$ are removed from the seed layers $S_1$ and $S_2$. Specifically, the resist patterns $X_1$ and $X_2$ are removed with a resist stripping solution. A known resist stripping solution can be used as the resist stripping solution. Examples thereof include aqueous solutions of alkalis such as sodium hydroxide and potassium hydroxide; solutions containing organic acids such as alkylbenzenesulfonic acid; and mixtures of organic amines such as ethanolamine and polar solvents.

(Substep of Etching Seed Layer)

Figure 4D:
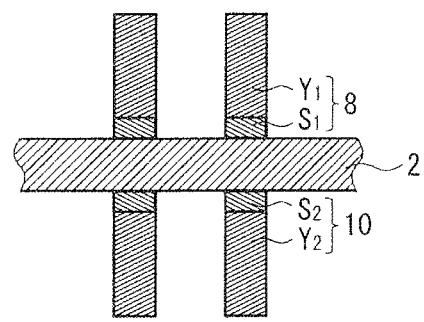
FIG. 4D is a schematic, partial cross-sectional view illustrating a substep subsequent to FIG. 4C in the step of forming a core body of the planar coil element of FIG. 1.

In the substep of etching the seed layers, the seed layers $S_1$ and $S_2$ are etched with the metal patterns $Y_1$ and $Y_2$ serving as masks. This etching results in a laminated body including the core bodies 8 and 10 stacked on the insulating base film 2, as illustrated in FIG. 4D.

<Step of Depositing Widening Layer>

Figure 4E:
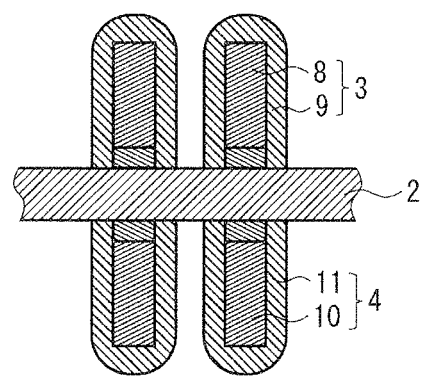
FIG. 4E is a schematic, partial cross-sectional view illustrating a step of depositing a widening layer in the method for producing the planar coil element of FIG. 1.

In the step of depositing the widening layers, the core bodies 8 and 10 are subjected to plating to deposit the widening layers 9 and 11. This results in the formation of the first conductive pattern 3 including the core body 8 and the widening layer 9 and the second conductive pattern 4 including the core body 10 and the widening layer 11, as illustrated in FIG. 4E. The plating may be performed once or multiple times. In the step of depositing the widening layers, the ratio of the average thickness of the first conductive pattern 3 to the average circuit pitch of the first conductive pattern and the ratio of the average thickness of the second conductive pattern 4 to the average circuit pitch of the second conductive pattern are adjusted to ½ or more and 5 or less.

The lower limit of the temperature during the plating for the formation of the widening layers 9 and 11 is preferably 10° C., more preferably 20° C. The upper limit of the temperature during the plating for the formation of the widening layers 9 and 11 is preferably 60° C., more preferably 50° C. If the temperature during the plating is lower than the lower limit, the widening layers 9 and 11 can have an insufficient thickness. If the temperature during the plating is higher than the upper limit, for example, the core bodies 8 and 10 can be deformed.

The lower limit of the plating time for the formation of the widening layers 9 and 11 is preferably 5 minutes, more preferably 10 minutes. The upper limit of the plating time for the formation of the widening layers 9 and 11 is preferably 200 minutes, more preferably 150 minutes. If the plating time is less than the lower limit, the widening layers 9 and 11 can have an insufficient thickness. If the plating time is more than the upper limit, the widening layers 9 and 11 have an increased thickness to easily cause, for example, short circuits in the first conductive pattern 3 and the second conductive pattern 4.

In the step of depositing the widening layers, the core bodies 8 and 10 are formed so as to have a cross section with a trapezoidal shape having two sides substantially parallel to the surface of the insulating base film 2, the base on the side of the insulating base film 2 being longer than the upper base; thus, metal ions are sufficiently charged to the bottom portions without accumulating metal ions on the upper base side of the core bodies 8 and 10 to easily form the rectangular portions in the first conductive pattern 3 and the second conductive pattern 4. Because the cross section of each of the core bodies 8 and 10 has the trapezoidal shape, edges of the top portions of the first conductive pattern 3 and the second conductive pattern 4 easily have beveled shapes based on the shapes of the core bodies 8 and 10, so that the cross-sectional shape of the top portion of each of the first conductive pattern 3 and the second conductive pattern 4 is easily closer to a semicircular shape. Examples of a method for forming the trapezoidal cross-sectional shape of each of the core bodies 8 and 10 include a method in which the cross-sectional shape of regions where the resist patterns $X_1$ and $X_2$ are not deposited is adjusted to a trapezoidal shape by adjusting an exposure angle in the substep of forming the resist patterns; and a method in which the metal patterns $Y_1$ and $Y_2$ are slightly etched with an etching solution in the substep of etching the seed layers.

<Step of Forming Through Hole>

In the step of forming the through hole, the through hole 7 electrically connecting the first conductive pattern 3 to the second conductive pattern 4 is formed. In the step of forming the through hole, the penetration hole 7a extending through the core bodies 8 and 10 and the insulating base film 2 is formed in a state in which the core body 8 on the first surface side of the insulating base film 2 and the core body 10 on the second surface side of the insulating base film 2 are formed. As with the substep of forming the widening layers, the plating film 7b is formed on the periphery of the penetration hole 7a. The plating film 7b may be formed simultaneously with or separately from the substep of depositing the widening layers.

In the step of forming the through hole, for example, after the first conductive pattern 3 and the second conductive pattern 4 are formed, the penetration hole 7a extending through the first conductive pattern 3, the insulating base film 2, and the second conductive pattern 4 may be formed. It may also be formed by injecting, for example, a silver paste or a copper paste into the penetration hole 7a and then curing the paste by heating.

<Insulating Resin Covering Step>

Figure 4F:
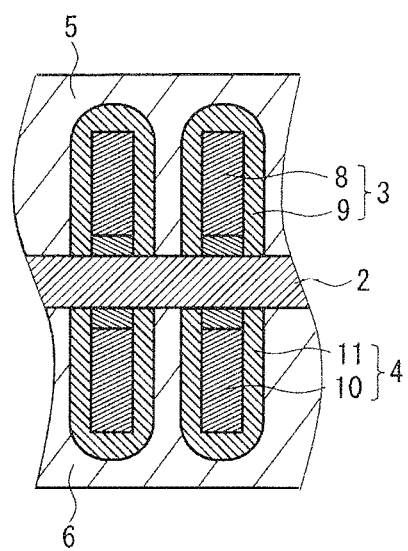
FIG. 4F is a schematic, partial cross-sectional view illustrating an insulating resin covering step in the method for producing the planar coil element of FIG. 1.

In an insulating resin covering step, the first insulating layer 5 covering the first conductive pattern 3 on the first surface side is formed by covering the first conductive pattern 3 on the first surface side with an insulating resin. In the insulating resin covering step, the second insulating layer 6 covering the second conductive pattern 4 on the second surface side is formed by covering the second conductive pattern 4 on the second surface side with the insulating resin. In the insulating resin covering step, the first insulating layer 5 is formed by applying the insulating resin, such as a thermosetting resin or an ultraviolet-curable resin, to the insulating base film 2 and the first conductive pattern 3 on the first surface side and then curing the insulating resin, as illustrated in FIG. 4F. The second insulating layer 6 is formed by applying the insulating resin to the insulating base film 2 and the second conductive pattern 4 on the second surface side and then curing the resin.

<Advantage>

Because the method for producing the planar coil element includes the step of forming the core body 8 of the first conductive pattern 3 by the subtractive method or the semi-additive method and the step of depositing the widening layer 9 of the first conductive pattern 3 on the outer surface of the core body 8 by plating, the circuit gap width of the first conductive pattern 3 can be reduced to increase the density of the first conductive pattern 3. In the method for producing the planar coil element, because the ratio of the average thickness of the first conductive pattern 3 to the average circuit pitch of the first conductive pattern 3 is within the range described above, it is possible to increase the thickness of the first conductive pattern 3 to increase the aspect ratio of the first conductive pattern 3 while the arrangement pattern is maintained at high density. Accordingly, in the method for producing the planar coil element, it is possible to easily and reliably produce the planar coil element 1 having a reduced size while the increase of the number of steps of the production method is inhibited.

Other Embodiments

The embodiments disclosed herein are to be considered in all respects as illustrative and not limiting. The scope of the invention is defined not by the configurations of the foregoing embodiments but by the following claims, and is intended to include any modifications within the scope and meaning equivalent to the scope of the claims.

Although the method for producing the first conductive pattern and the second conductive pattern by the semi-additive method has been described in detail in the foregoing embodiment, the first conductive pattern and the second conductive pattern may be formed by a subtractive method. In the case where the first conductive pattern and the second conductive pattern are formed by the subtractive method, the first conductive pattern and the second conductive pattern can be formed by, for example, a step of laminating metal foil sheets on an insulating base film, a step of forming resist patterns on surfaces of the metal foil sheets, a step of etching the metal foil sheets with the resist patterns serving as masks, and a step of removing the resist patterns. Each of the first conductive pattern and the second conductive pattern may not necessarily include the externally extending lead portion connected to the outermost end part of the spiral portion.

The planar coil element may further include, for example, outer insulating layers on the outer surfaces of the first insulating layer and the second insulating layer. The outer insulating layers are formed by, for example, bonding films having insulating properties and flexibility to the outer surfaces of the first insulating layer and the second insulating layer with, for example, an adhesive. Examples of the main component of the outer insulating layers include synthetic resins such as polyimides, epoxy resins, phenolic resins, acrylic resins, polyesters, thermoplastic polyimides, poly(ethylene terephthalate), fluororesins, and liquid crystal polymers.

In the planar coil, the conductive pattern and the insulating layer need not necessarily be provided on each surface of the insulating base film. The planar coil may only include the first conductive pattern deposited on the first surface side of the insulating base film and the first insulating layer covering the first conductive pattern on the first surface side. In the planar coil, the first conductive pattern and the second conductive pattern may not necessarily be electrically connected to each other with the through hole.

Each of the first conductive pattern and the second conductive pattern need not necessarily include the rectangular portion and the top portion. For example, each may include the rectangular portion alone. The entire cross-sectional shape may be, for example, a trapezoidal shape or a semicircular shape. The cross-sectional shape of the top portion may not necessarily be a semicircular shape.

The insulating base film need not necessarily have flexibility and may be composed of, for example, a rigid material such as a glass substrate.

Surface treated layers may be formed on the outer surfaces of the widening layers. When the conductive patterns include the surface treated layers, the leakage of a conductive component from the conductive patterns or the diffusion of reactive components (for example, oxygen and sulfur) with the conductive component into the conductive patterns is reduced.

Any material that can prevent the leakage of the conductive component from the conductive patterns or the diffusion of the reactive components into the conductive patterns may be used as a material for the surface treated layers. Examples thereof include metals, resins, ceramics, and mixtures thereof. Among these, nickel, tin, gold, or aluminum is preferred as the main component of the surface treated layers. Each of the surface treated layers may have a single-layer structure or a multilayer structure.

The surfaces of the conductive patterns may be subjected to antirust treatment with Copper Brite in place of the formation of the surface treated layers. The term "Copper Brite" indicates a solution of a water-soluble polymer, such as a polyoxyethylene alkyl ether, in isopropyl alcohol and hydroxybutyric acid.

INDUSTRIAL APPLICABILITY

As described above, the planar coil element of the present invention can have a reduced size and are suitably used for various electronic devices with reduced size and weight. The method for producing a planar coil element according to the present invention is suitable for the production of a planar coil element used for various electronic devices with reduced size and weight.

The invention claimed is:

1. A planar coil element comprising an insulating base film having a first surface and a second surface opposite to the first surface, a first conductive pattern deposited on the first surface side of the insulating base film, and a first insulating layer covering the first conductive pattern on the first surface side,
   wherein the first conductive pattern includes a core body and a widening layer deposited on an outer surface of the core body,
   a ratio of an average thickness of the first conductive pattern to an average circuit pitch of the first conductive pattern is ½ to 5,
   the first conductive pattern includes a rectangular portion that is deposited on the first surface side of the insulating base film and that has a rectangular cross-sectional shape, and a top portion that extends continuously from a surface of the rectangular portion opposite to the surface on which the insulating base film lies and that has a cross section with a semicircular shape, and
   an average shortest distance from the top portion of the first conductive pattern to a surface of the first insulating layer on the first surface side of the insulating base film is 3 μm to 40 μm.

2. The planar coil element according to claim 1, wherein the first conductive pattern has an average circuit pitch of 20 μm to 100 μm.

3. The planar coil element according to claim 1, wherein a ratio of an average circuit gap width at a height position of ½ the average thickness to an average circuit gap width in a bottom portion of the first conductive pattern is 2 or less.

4. The planar coil element according to claim 3, wherein a ratio of an average circuit gap width at a height position of ⅔ the average thickness to the average circuit gap width in the bottom portion of the first conductive pattern is 2 or less.

5. The planar coil element according to claim 1, wherein each of the core body and the widening layer contains copper or a copper alloy as a main component.

6. The planar coil element according to claim 1, wherein the insulating base film contains a polyimide as a main component, and the first insulating layer contains an epoxy resin as a main component.

7. The planar coil element according to claim 1, further comprising a second conductive pattern deposited on the second surface side of the insulating base film, and a second insulating layer covering the second conductive pattern on the second surface side,
   wherein the second conductive pattern includes a core body and a widening layer deposited on an outer surface of the core body.

8. The planar coil element according to claim 7, further comprising a through hole electrically connecting the first conductive pattern to the second conductive pattern.

9. The planar coil element according to claim 7, wherein the first conductive pattern and the second conductive pattern have an identical pattern, and
   a difference in position in a width direction between a center line of the first conductive pattern and a center line of the second conductive pattern is 40% or less of the average circuit pitch.

* * * * *